(12) United States Patent
Watanabe

(10) Patent No.: US 6,573,557 B1
(45) Date of Patent: Jun. 3, 2003

(54) EEPROM CELL HAVING REDUCED CELL AREA

(75) Inventor: Hitomi Watanabe, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/552,441

(22) Filed: Apr. 18, 2000

(30) Foreign Application Priority Data

Apr. 27, 1999 (JP) .......................................... 11-119865

(51) Int. Cl.$^7$ ............................................. H01L 29/788
(52) U.S. Cl. ...................... 257/318; 257/314; 257/315
(58) Field of Search .................... 257/314, 315, 257/316, 317, 318, 319, 320, 321; 438/261, 263, 267; 365/185.28, 185.15

(56) References Cited

U.S. PATENT DOCUMENTS

| | | | | |
|---|---|---|---|---|
| 4,754,320 A | * | 6/1988 | Mizutani et al. | |
| 5,150,178 A | * | 9/1992 | Mori | |
| 5,181,090 A | * | 1/1993 | Maruo | |
| 5,291,046 A | * | 3/1994 | Kumakura | |
| 5,656,838 A | * | 8/1997 | Shinmori | |

FOREIGN PATENT DOCUMENTS

| JP | 59-155968 | * | 9/1984 |
|---|---|---|---|
| JP | 11-087664 A | * | 3/1999 |

* cited by examiner

Primary Examiner—Nathan J. Flynn
Assistant Examiner—Kevin Quinto
(74) Attorney, Agent, or Firm—Adams & Wilks

(57) ABSTRACT

An EEPROM cell having one layer of polycrystalline silicon in which a memory cell area is reduced without damaging cell characteristics by providing a channel length of a select gate transistor and a channel length of a cell transistor to extend perpendicularly to each other, and that a select gate electrode and a control gate electrode of an impurity diffusion layer are arranged in parallel with each other, and a cell source wiring is made of a metal wiring through a contact, so that a parasitic transistor on the control gate wiring is eliminated and it becomes possible to effectively reduce the cell area.

6 Claims, 3 Drawing Sheets

EEPROM CELL HAVING REDUCED CELL AREA

BACKGROUND OF THE INVENTION

1. Field of the Invention

The present invention relates to a semiconductor device, and particularly to a structure of an EEPROM cell made of one-layer polycrystalline silicon.

2. Description of the Related Art

Conventionally, for the purpose of forming an EEPROM cell on a silicon semiconductor substrate by using one-layer polycrystalline silicon, the following structure has been used.

As shown in FIG. 6, there is a select gate transistor constituted by a first impurity diffusion layer 22 and a second impurity diffusion layer 23 separated by a first channel region 21, and a select gate electrode 24 formed over the first channel region 21 through an insulating film and made of, for example, polycrystalline silicon.

There is a cell transistor constituted by the second impurity diffusion layer 23 and a third impurity diffusion layer 26 separated by a second channel region 25, and a floating gate electrode 27 formed over the second channel region 25 and the second impurity diffusion layer through an insulating film and made of, for example, polycrystalline silicon. Here, in the insulating film region on the second impurity diffusion layer 23, a first tunnel insulating film region 28 made of a thin insulating film is formed under the floating gate electrode 27.

The select gate transistor and the cell transistor are arranged so that the first channel region 21 and the second channel region 25 are formed to be parallel and on a line, and a cell source line becomes a diffusion wiring of the third impurity diffusion layer 26.

Next, an impurity diffusion layer, which becomes a control gate, is formed in parallel with the channel direction of the first channel region 21 and the second channel region 25. At this time, since the select gate electrode intersects with the control gate diffusion layer, the control gate comes to have a fourth impurity diffusion layer 30 and a fifth impurity diffusion layer 31 separated by a third channel region 29 parasitically formed.

Moreover, the floating gate electrode,27 is formed, which is connected with the gate of the cell transistor through a second tunnel insulating film region 32 made of a thin insulating film in an insulating film region on the fifth impurity diffusion layer 31.

Finally, a bit line wiring is connected with the first impurity diffusion layer 22 through a bit line contact 33, and a control gate wiring is connected with the fourth impurity diffusion layer 30 through a control gate contact 34.

In the conventional structure, since the impurity diffusion layer region of the cell transistor and the select gate transistor, and the impurity diffusion layer region of the control gate wiring are arranged in parallel with each other, there have been problems as set forth below.

1. Since the select gate electrode passes over the control gate wiring, a parasitic transistor is formed in front of the control gate, so that a writing voltage given to the control gate is lowered.

2. Since the parasitic transistor exists, and separation is made to the cell source wiring made of the impurity diffusion layer, it is difficult to reduce a memory cell area, and in order to reduce the area, for example, the wiring is made to have three layers or four layers, so that the number of steps is increased.

3. Since the cell source wiring is made of the impurity diffusion layer, when a cell is made minute, a source resistance is increased, so that it is difficult to effectively obtain a cell current.

SUMMARY OF THE INVENTION

An object of the invention is to eliminate the foregoing problems by improving the conventional structure.

According to the invention, a semiconductor device has such a structure that a cell transistor and a select gate transistor are arranged perpendicularly to each other, a select gate electrode and a control gate wiring are arranged in parallel with each other, and a cell source wiring is made of a metal wiring through a contact. Thus, this structure has functions as set forth below.

1. Since a parasitic transistor is not formed on the control gate wiring, a writing voltage can be effectively given to a control gate.

2. A memory cell area can be made small without increasing wirings more than required.

3. When a cell is made minute, an influence of a cell source impurity diffusion resistance is low, and a cell current can be effectively obtained.

DETAILED DESCRIPTION OF THE PREFERRED EMBODIMENTS

Embodiments of the invention will be described below.

Figure 5:
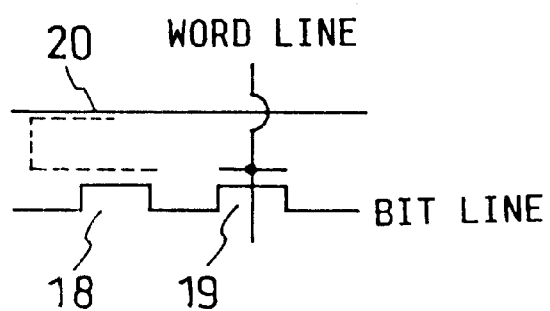
FIG. 5 is a circuit view of the invention.
Figure 6:
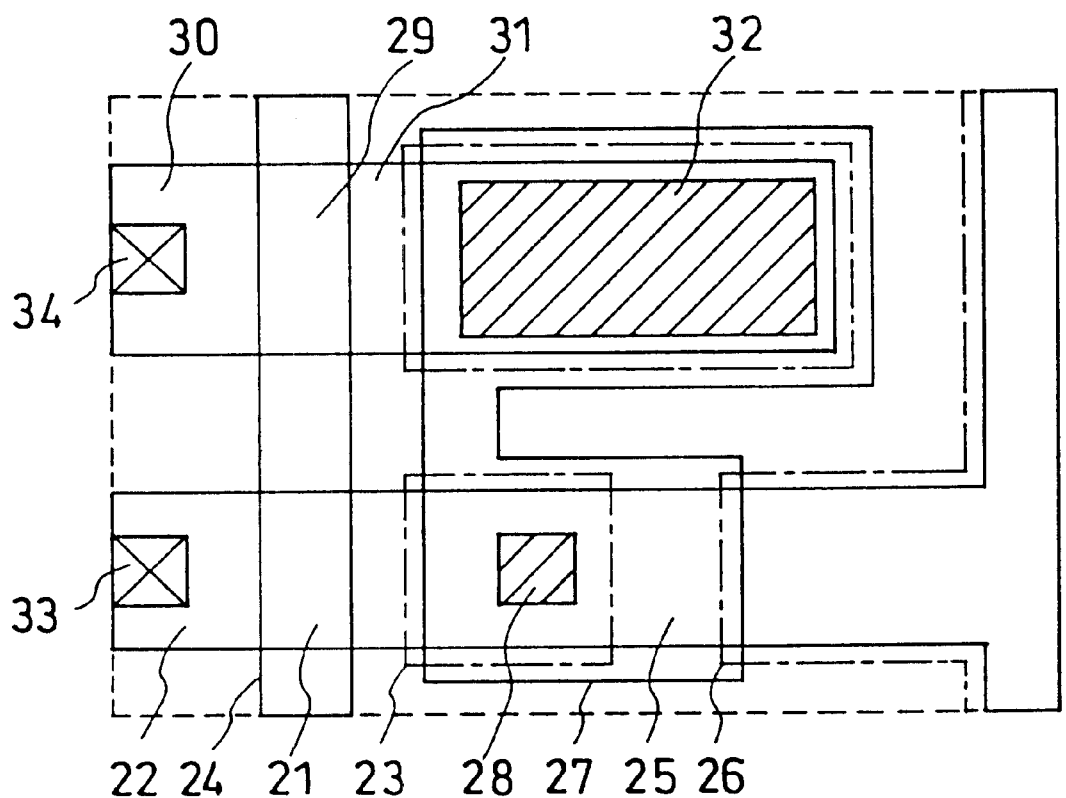
FIG. 6 is a plan view showing a conventional structure.

Respective transistors and elements for constituting an EEPROM cell are formed on a semiconductor substrate, and respectively has, for example, a MOS structure, and the cell includes, as shown in a circuit view of FIG. 5, a cell transistor 18 for holding storage information, a select gate transistor 19 for operation-selecting the cell transistor, and a control gate 20 for writing/erasing storage information of the cell transistor.

Figure 1:
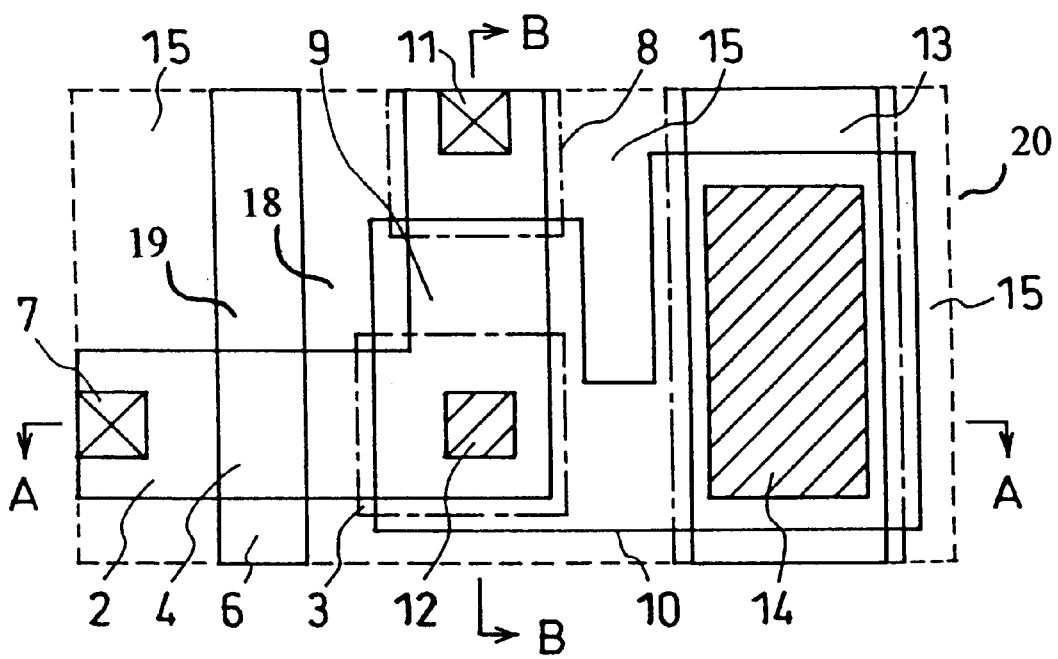
FIG. 1 is a plan view showing the invention.
Figure 2:
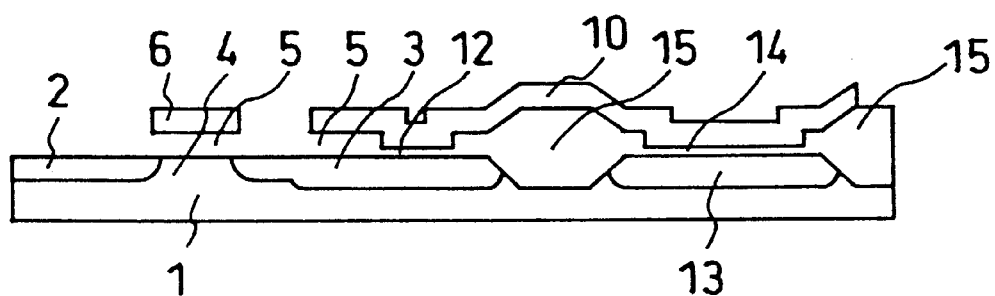
FIG. 2 is a sectional view taken along the line A—A of FIG. 1.
Figure 3:
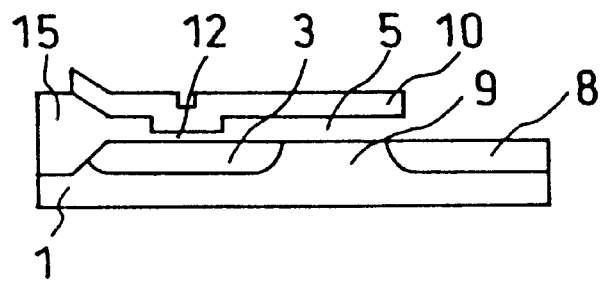
FIG. 3 is a sectional view taken along the line B—B of FIG. 1.

FIG. 1 is a plan view showing the invention, FIG. 2 is a sectional view taken along the line A—A of FIG. 1, and FIG. 3 is a sectional view taken along the line B—B of FIG. 1. As shown in FIGS. 1 to 3, and as shown in a one-bit structure, the EEPROM cell of the invention is formed on a silicon substrate 1 of a first conductivity type, for example, a P type.

First, the select gate transistor is constituted by a first impurity diffusion layer 2 formed on the silicon substrate 1 and having a second conductivity type of an opposite conductivity type of the silicon substrate, for example, an N type, and a second impurity diffusion layer 3 of the second conductivity type. The first impurity diffusion layer and the second impurity diffusion layer are separated by a first channel region 4 on the silicon substrate 1.

A select gate electrode 6 made of a first conductive film and connected to a word line is formed over the first channel region 4 through an insulating film 5, for example, a silicon oxide film. At this time, the first impurity diffusion layer 2 is connected to a bit line made of a metal wiring through a bit line contact 7.

The cell transistor 18 is constituted by the second impurity diffusion layer 3 of the second conductivity type formed on the silicon substrate 1 and a third impurity diffusion layer 8 of the second conductivity type. The second impurity diffusion layer 3 and the third impurity diffusion layer 8 are separated by a second channel region 9 on the silicon substrate 1, and this second channel region 9 is disposed so that its channel direction becomes perpendicular to the first channel region 4. That is, the channel direction of the cell transistor 18 becomes parallel with the select gate electrode 6.

Then a floating gate electrode 10 as a gate of the cell transistor, made of a second conductive film is formed so as to cover the second channel region 9 and the second impurity diffusion layer 3 through the insulating film 5, for example, a silicon oxide film.

In the region of the insulating film 5 on the second impurity diffusion layer 3, a first tunnel insulating film region 12 made of, for example, a silicon oxide film with a thickness of from about 10 to 120 Å is formed under the floating gate electrode 10. The potential of the floating gate electrode 10 is changed by movement of an electric charge through the tunnel window 12, and storage of information becomes possible.

Moreover, the third impurity diffusion layer 8 is connected to a cell source line made of a metal wiring through a source contact 11.

The control gate 20 is constituted by a fourth impurity diffusion layer 13 of the second conductivity type, which is formed on the silicon substrate 1 and becomes a control gate wiring, and the second conductive film 10 which is formed over the fourth impurity diffusion layer 13 through the insulating film 5 and is connected to the gate of the cell transistor. The fourth impurity diffusion layer is disposed so that the second impurity diffusion layer 3 intervenes between the diffusion layer and the select gate electrode 6. That is, the select gate electrode 6, the channel direction of the cell transistor 18, and the control gate wiring becomes parallel with one another.

In the region of the insulating film 5 on the fourth impurity diffusion layer 13, a second tunnel insulating film region 14 made of, for example, a silicon oxide film of from about 10 to 120 Å is formed under the floating gate electrode 10. Through the second tunnel insulating film region 14, capacity coupling is made between the fourth impurity diffusion layer 13 which becomes the control gate wiring and the floating gate electrode 10.

In order to effectively carry out the movement of an electric charge to the floating gate electrode 10, it is desirable that the second tunnel insulating film region 14 has an area wider than the first tunnel insulating film region 12. Similarly, in order to effectively make capacity coupling, it is desirable that the floating gate electrode on a non-impurity diffusion layer for connecting the floating gate electrode 10 at the side of the control gate and that at the side of the cell transistor is decreased to the smallest area as possible.

The insulating film 5 has a thickness of from 250 to 2000 Å, and there is a case where its thickness is uneven even in the same plane because of a substrate impurity concentration or forming step. The respective impurity diffusion layers are basically separated by the channel regions or a field insulating film region 15.

By making the EEPROM cell structure as described above, since the cell source wiring can be made the metal wiring through the source contact at the cell transistor source portion, the influence of the source impurity diffusion resistance when the cell is made minute can be almost neglected, and it is possible to effectively obtain a cell current.

At the same time, since a parasitic transistor on the control gate wiring by the select gate electrode disappears, a writing voltage is effectively applied to the control gate, and reduction of a cell becomes possible so that it is possible to make a memory cell area by the same design rule about 70% of that of a conventional structure.

Besides, when the select gate electrode of the first conductive film and the floating gate electrode of the second conductive film are formed by patterning and etching one layer, for example, a film of polycrystalline silicon or silicide, and the bit line and the cell source wiring are formed by patterning and etching another layer, for example, a film of aluminum, aluminum-silicon, aluminum-silicon-copper, aluminum-copper, or the like, the EEPROM cell can be structured by wirings of only two layers, so that it is possible to lessen and facilitate the manufacturing steps.

Next, an embodiment of an EEPROM cell arrangement structure of the invention will be described.

Figure 4:
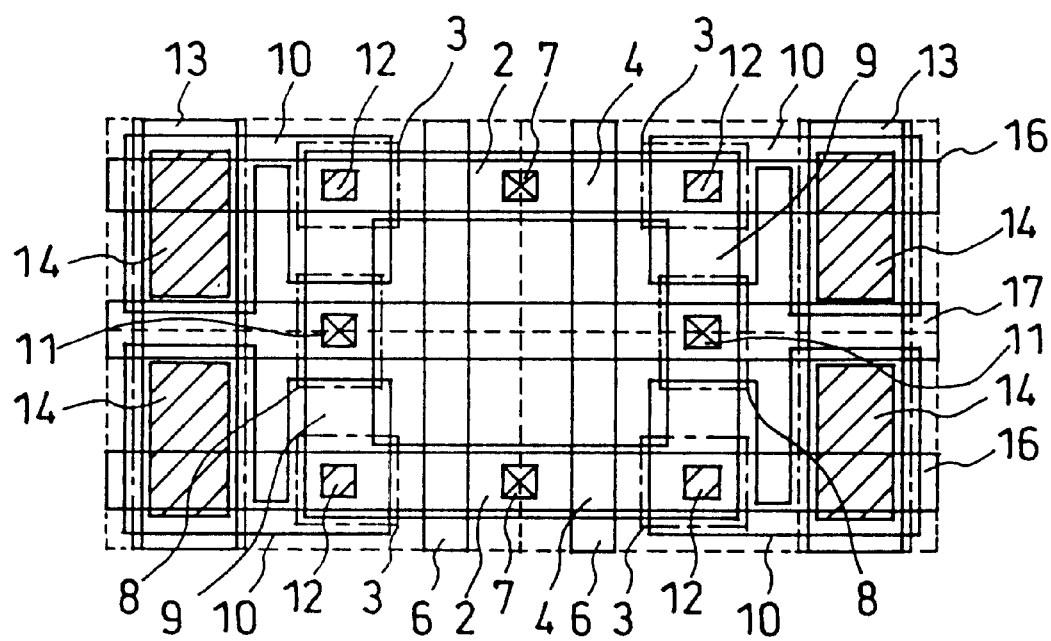
FIG. 4 is a plan view showing another embodiment of the invention.

FIG. 4 shows a 2-word line 2-bit line structure in which the 4-bit arrangement of the memory cells of the invention shown in FIG. 1 is made.

As shown in FIG. 4, the respective EEPROM cells are arranged to have mirror symmetry with respect to bit line contacts 7 and source contacts 11. That is, such a structure is made that two select gate wirings 6 at both sides of the bit line contacts 7 respectively form two word lines, two bit line wirings 16 are arranged perpendicularly to the word lines, and a source line wiring 17 is parallel with the bit line wirings 16 and is sandwiched therebetween.

By repeating the foregoing memory cell arrangement vertically and horizontally, it is possible to construct an EEPROM cell array having an arbitrary bit capacity.

As described above, since the invention provides such a structure that a parasitic transistor on a control gate wiring due to a select gate wiring is not formed, a memory cell can be effectively made minute through simple manufacturing steps and without damaging memory cell characteristics, and the manufacturing cost can be reduced.

What is claimed is:

1. A memory cell comprising:
 a select gate transistor formed in a semiconductor substrate and comprising a first impurity diffusion region formed in the substrate, a second impurity diffusion region formed in the substrate, a first channel region formed in the substrate between the first and second impurity diffusion regions, and a select gate electrode formed over the first channel region;
 a cell transistor selectable by the select gate transistor for storing data and comprising the second impurity diffusion region, a third impurity diffusion region formed in the substrate, a second channel region formed in the substrate between the second and third impurity diffusion regions, and a floating gate electrode formed over the second channel region and the second impurity diffusion region through a first tunnel insulating film, a channel length of the cell transistor being perpendicular to a channel length of the select gate transistor; and a control gate for controlling the writing and erasing of data in the cell transistor comprising a fourth impurity diffusion region formed in the substrate and a portion of the floating gate electrode extended to cover the fourth impurity diffusion region through a second tunnel insulating film.

2. A memory cell according to claim 1; wherein the channel of the cell transistor and the channel of the select gate transistor are formed on the same plane.

3. A memory cell according to claim 1; wherein the floating gate electrode of the cell transistor, the electrode of the control gate, and the gate electrode of the select gate transistor are formed of a single layer of polycrystalline silicon.

4. A memory cell according to claim 3; wherein a portion of the fourth impurity diffusion region is capacitively coupled to the extended portion of the floating gate electrode through an insulating film.

5. A memory cell according to claim 4; wherein a portion of the third diffusion region of the cell transistor is capacitively coupled to the floating gate electrode, and an area of the electrode of the control gate capacitively coupled with the fourth impurity diffusion region is larger than the area of the third diffusion region capacitively coupled to the floating gate electrode.

6. A memory cell according to claim 1; wherein the gate electrode of the select gate transistor and the control gate are parallel with each other, and the cell transistor is located between the gate electrode of the select gate transistor and the control gate.

* * * * *